United States Patent [19]

Akazawa et al.

[11] 4,415,882
[45] Nov. 15, 1983

[54] ANALOG TO DIGITAL CONVERTER

[75] Inventors: Yukio Akazawa, Iruma; Yasuyuki Matsuya, Tokyo; Atsushi Iwata, Tokorozawa, all of Japan

[73] Assignee: Nippon Telegraph & Telephone Public Corporation, Tokyo, Japan

[21] Appl. No.: 299,121

[22] Filed: Sep. 3, 1981

[30] Foreign Application Priority Data

Jul. 31, 1981 [JP] Japan .................... 56-108136

[51] Int. Cl.³ ............................ H03K 13/02
[52] U.S. Cl. ................ 340/347 AD; 340/347 CC; 340/347 DA
[58] Field of Search ............. 340/347 AD, 347 DA, 340/347 CC

[56] References Cited

U.S. PATENT DOCUMENTS

| 3,216,001 | 11/1965 | Hinrichs | 340/347 AD |
| 3,735,392 | 5/1973 | Kaneko | 340/347 AD |
| 4,097,753 | 6/1978 | Cook | 340/347 CC |
| 4,318,085 | 3/1982 | Whiteside | 340/347 DA |

FOREIGN PATENT DOCUMENTS

| 3003099 | 7/1980 | Fed. Rep. of Germany | 340/347 CC |
| 54-58341 | 5/1979 | Japan | 340/347 CC |

OTHER PUBLICATIONS

Connolly, "1980 IEEE International Solid-State Circuits Conference, Digest of Technical Papers", pp. 12-13, Feb. 13, 1980.

Primary Examiner—C. D. Miller
Attorney, Agent, or Firm—Spencer, Kaye & Frank

[57] ABSTRACT

The analog output from a local DAC comprising an LDAC and an MDAC, in which the full scale of the LDAC is always larger than the quantized level of the MDAC, is compared with an input analog signal which is sampled and held. A digital code obtained by successive approximation in accordance with the result of the comparison is stored in a successive approximation register. A shift code for calibrating the D/A conversion in the local DAC by shifting the digital code which is previously allotted to each digital code is stored in a shift code generating circuit (ROM). The digital code from the successive approximation register is digitally shifted in accordance with the shift code by a code shift circuit such as a digital adder/subtractor to obtain an A/D conversion output. An analog to digital converter with a high accuracy and an improved conversion speed is inexpensively fabricated in the form of a one chip LSI by a usual CMOS process.

8 Claims, 10 Drawing Figures

ANALOG TO DIGITAL CONVERTER

BACKGROUND OF THE INVENTION

The present invention relates to a successive approximation analog to digital converter for converting an analog signal to a corresponding digital signal. More particularly, the invention relates to an analog to digital converter which is characterized by high accuracy and high conversion speed employs components having low matching tolerances and easily performs digital calibrations.

In a successive approximation analog to digital (A/D) converter of this type, an analog to digital coverter is known in which the calibration is carried out in a digital manner, so that a high accuracy characteristic is obtained with a low accuracy digital to analog (D/A) converter. For example, a monolithic 13 bit A/D converter is disclosed in Session 1: A/D and D/A converters, pages 12 and 13, Digest of Technical Papers, 1980 IEEE International Solid-State Circuits Conference, Feb. 13, 1980. In this A/D converter, a high accuracy local D/A converter is realized by combining a usual successive approximation A/D converter with an analog adder/subtractor, an additional D/A converter for generating an analog calibration value and a calibration code memory circuit such as a ROM (read only memory).

A significant problem encountered when a successive approximation A/D converter is constructed by using such a D/A converter (referred to as DAC), is that high speed operation can not be expected. In the DAC, while it is sufficient that the calibration be performed only with respect to higher order bits from which errors occur, it is required to access a memory circuit such as a ROM or RAM (random access memory) to read out a proper calibration code at each successive approximation operation of the higher order bits. Therefore, there is a disadvantage in that the conversion operation is greatly delayed, when the number of bits is increased in order to improve the accuracy of the A/D conversion.

When an LSI process of the MOS family is used for circuit fabrication, with many advantages such as low power dissipation, high integration density, and facility for realizing a high accuracy sample/hold which is essential to the successive approximation A/D converter, a capacitor array is preferably used as a circuit arrangement for the DAC. In this case, in order to realize an accuracy of 14 bits or more, the unit capacitance can not be reduced very much from the viewpoint of the accuracy of the components, even if the calibration is performed. Considering the settling time of the DAC, the access time of the memory circuit and the settling time of the adder/subtractor, it is more difficult to improve the conversion time of the DAC as higher accuracy is required. Accordingly, the conversion time of the A/D converter is greatly inferior to that of the original A/D converter in which the calibration is not performed. When a high performance A/D converter with an accuracy of 14 bits or more and a conversion speed of 60 ksps (kilo samples per sec) is required, such as an A/D converter for high quality voice processing, such an A/D converter can hardly be realized in the form of LSI or the like.

In order to improve the accuracy of the A/D converter, an analog adder/subtractor with a high accuracy and additional DAC for generating an analog calibration value are required. Usually, it is very difficult to ensure an accuracy of 14 or 15 bits, due to the non-linearity error of the adder/subtractor which is influenced by noise and so on. Thus, the adder/subtractor hinders the improvement of an accuracy of the A/D converter.

Particularly, in order to realize the analog subtracting function, there are required a polarity inverting circuit and an adder/subtractor control function. The requirement also hinders the improvement of accuracy and the reduction of chip area.

As described above, the conventional A/D converter of this type allows little improvement of the converting speed, improvement in the accuracy by calibration is limited, and it is particularly difficult to fabricate the adder/subtractor.

SUMMARY OF THE INVENTION

Accordingly, an object of the present invention is to provide an analog to digital converter with a high accuracy and an improved conversion time in which a local D/A converter is so constructed that all of the quantized analog levels exist, calibration amounts are stored in the form of digital codes, and the calibration codes are subject to digital addition or subtraction to obtain correct digital outputs, thereby overcoming the above-described disadvantages.

To achieve the above object, in one aspect of the present invention, there is provided an analog to digital converter which comprises a sample/hold circuit for sampling and holding an analog input signal, a local digital to analog converter having a first digital to analog converter for producing an output of higher order bits and a second digital to analog converter for producing a full scale output as an output of lower order bits which is always larger than every quantizing level of the first digital to analog converter, and in which the output of the first digital to analog converter is added to the output of the second digital to analog converter to provide an analog output, a comparator for comparing the sample/hold output from the sample/hold circuit with the analog output from the local digital to analog converter, a successive approximation register for storing a digital code obtained by performing a successive approximation in accordance with the output from the comparator, a shift code generator for storing a shift code for shifting the digital code which is previously allotted to each digital code from the successive approximation register in order to calibrate the characteristic of the local digital to analog converter for an ideal digital to analog conversion characteristic, and for producing a shift code in response to the digital code from the successive approximation register, and a code shift circuit for digitally shifting the digital code from the successive approximation register in accordance with the shift code from the shift code generator to correct an analog to digital conversion output signal.

In a preferred embodiment of the present invention, the code shift circuit may be a digital adder/subtractor for performing digital addition/subtraction between the digital output code and the shift code.

In another preferred embodiment of the invention, the linearity of the second digital to analog converter is ensured, and the shift code generator stores, as the shift code, the difference between an input digital code corresponding to an analog output on an ideal characteristic as a digital to analog conversion characteristic obtained by extrapolating the output characteristic of the second digital to analog converter over a range extending to the higher order bits, and an input digital code allowing the local digital to analog converter to produce an ideal analog output.

In another aspect of the present invention, an analog to digital converter comprises a sample/hold circuit for sampling and holding an analog input signal, a local digital to analog converter for producing a full scale output of a lower order bit portion which is always larger than every quantizing level of the higher order bit portion, a comparator for comparing the sample/hold output from the sample/hold circuit with the analog output from the local digital to analog converter, a successive approximation register for storing a digital code obtained by performing a successive approximation in accordance with the output from the comparator, a shift code generator for storing a shift code for shifting the digital code which is previously allotted to each digital code from the successive approximation register in order to calibrate the characteristic of the local digital to analog converter for an ideal digital to analog conversion characteristic, and for producing a shift code in response to the digital code from the successive approximation register, and a code shift circuit for digitally shifting the digital code from the successive approximation register in accordance with the shift code from the shift code generator to correct the analog to digital conversion output signal.

In a preferred embodiment of the present invention, the code shift circuit may be a digital adder/subtractor for performing digital output addition/subtraction between the digital code and the shift code.

In another embodiment of the present invention, the shift code generator stores, as the shift code, the difference between an input digital code corresponding to an analog output on an ideal characteristic as a digital to analog conversion characteristic obtained by extrapolating a digital to analog conversion output characteristic from the lower order bit portion over a range extending beyond the least significant bit in the higher order bit portion, and an input digital code allowing the local digital to analog converter to produce an ideal analog output.

DESCRIPTION OF THE PREFERRED EMBODIMENTS

Figure 1:
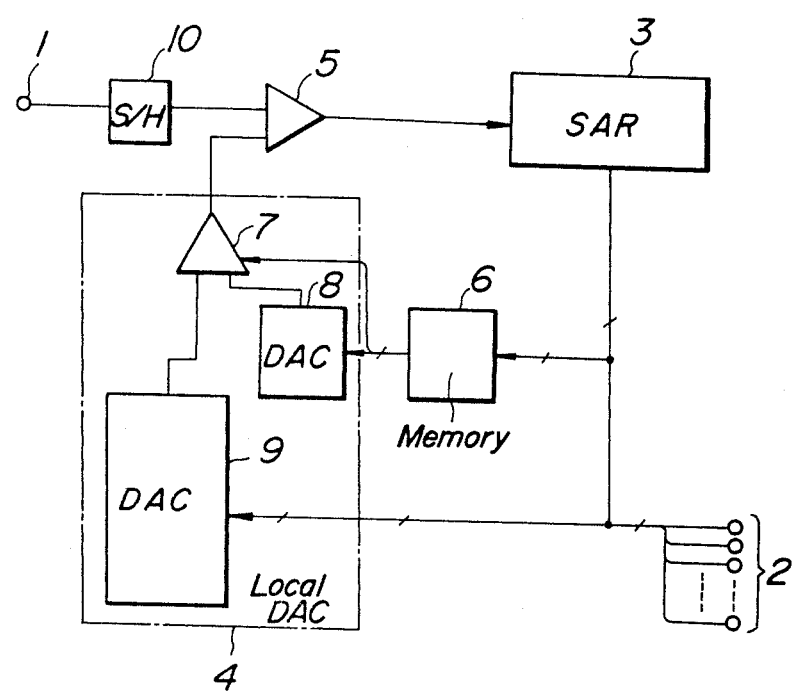
FIG. 1 is a block diagram showing a successive approximation A/D converter for performing conventional calibration technology by digital processing.

An embodiment of a conventional successive approximation analog to digital converter, which performs digital calibration to obtain a high accuracy characteristic despite the use of low accuracy components is shown in FIG. 1. Here, reference numeral 1 designates an analog input terminal, 2 a digital output terminal, 3 a successive approximation register (abbreviated as SAR), 4 a local DAC, 5 a comparator, 6 a shift code generating circuit in the form of a memory such as an ROM for storing calibration codes, 7 an analog adder/subtractor, 8 a DAC for generating an analog calibration value, 9 an original local DAC subject to calibration, and 10 a sample/hold circuit. In order to obtain high accuracy with the original local DAC 9, the A/D converter shown in FIG. 1 uses the analog adder/subtractor 7, the DAC 8 for generating an analog calibration value and the ROM 6 for storing calibration values, in addition to the usual successive approximation A/D converter.

Figure 2:
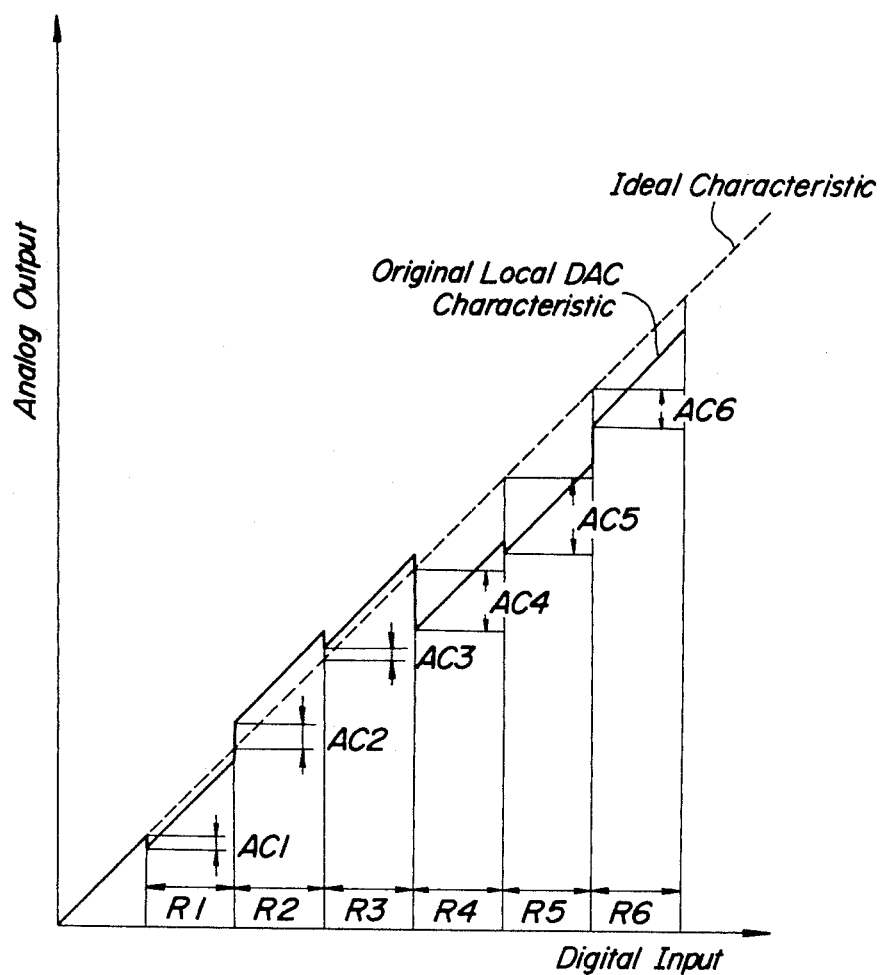
FIG. 2 is a graphical representation for explaining the principle of the conventional calibration technology.

The principle of the successive approximation A/D converter thus arranged is shown in FIG. 2. In the figure, the broken line indicates an ideal characteristic for the local DAC. The solid line shows the characteristic of the original local DAC 9 before calibration. Generally, in the error characteristic of the D/A converter, the contribution of the respective bits to the error is greater as the bit order is higher, and smaller as the bit order is lower. As illustrated in FIG. 2, the characteristic curve of the original DAC in the lower order bits substantially coincides with the corresponding portion of the ideal characteristic. Thus, for the calibration of the DAC, it is usual that error values of the higher order bits are produced in accordance with the higher order bits, and are added to or subtracted from an analog output from the original local DAC 9. More specifically, segmental regions designated as $R_1, R_2, \ldots, R_6$ in FIG. 2 are those segmented by the higher order bits in the digital input. The error values, i.e. calibration analog values $AC_1, AC_2, \ldots, AC_6$ are produced corresponding to the respective regions, and added to or subtracted fron the analog output signal from the original local DAC 9 to perform the calibration.

The operation of the circuit arrangement shown in FIG. 1 will be described. The DAC 8 produces an absolute value of the error corresponding to the higher order bits in input codes to the original local DAC 9. The analog calibration value thus produced is added to or subtracted from the output signal from the original local DAC 9 by the analog adder/subtractor 7. A digital signal for designating the addition or the subtraction and input codes to cause the DAC 8 for generating analog calibration values to produce a given error value are previously stored in the memory circuit 6.

In the operation of the local DAC 4, corresponding to the code designated by the SAR 3, the memory circuit 6 is accessed by the higher order bits of that code, so that the analog calibration value generating DAC 8 produces an error value so as to cancel the error of the original local DAC 9. The calibration value and the conversion output from the DAC 9 are subjected to the addition or subtraction in the analog adder/subtractor 7. As described above, in the conventional technology, the accuracy improvement of the successive approximation A/D converter by means of digital processing is carried out by calibrating the original local DAC 9.

When constructing a successive approximation A/D converter by using such a DAC, a problem encountered is that a high speed conversion operation can not be expected. While it is sufficient that the calibration processing is applied only to the higher order bits of the digital input, the memory circuit 6 such as a ROM or RAM must be accessed for each successive approximation operation of the higher order bits to read out a proper calibration value. Thus, there is a disadvantage in that the conversion operation is greatly delayed, if the number of bits is increased to improve the A/D conversion accuracy. Here, if it is assumed that the numbers of the upper and lower order bits are m and l, respectively, the conversion speed $T_{CONV}$ is given as follows:

$$T_{CONV} = m \times (T_R + T_{DAC} + T_{COM} + T_{SAR}) + l \times (T_{DAC} + T_{COM} + T_{SAR}),$$

where $T_R$ is the access time of the memory circuit 6, $T_{DAC}$ the settling time of the local DAC 4, $T_{COM}$ the response time of the comparator 5, and $T_{SAR}$ the delay time of the successive approximation register 3.

When an LSI process of the MOS family is used for circuit fabrication, with many advantages such as low power dissipation, high integration density, and the facility of a high accuracy sample/hold which is essential to the successive approximation A/D converter, a capacitor array DAC is preferably used as a circuit arrangement for the local DAC. In this case, in order to realize an accuracy of 14 bits or more, the unit capacitance can not be reduced very much from the viewpoint of the accuracy of the components, even if the calibration is performed. The settling time $T_{DAC}$ is approximately 500 ns. The access time $T_R$ of the memory circuit is 400 to 1,000 ns. The settling time of the adder/subtractor 7 is about 1 µs. This settling time is hardly shortened, as the accuracy becomes higher. Accordingly, the conversion speed of the A/D converter is greatly deteriorated from that of the original A/D converter before calibration. When a high performance A/D converter with an accuracy of 14 bits or more and a conversion speed of 60 ksps (conversion time $T_{CONV} = 16.7$ µs), such as an A/D converter for high quality voice processing is required, such an A/D converter can hardly be realized in the form of LSI or the like.

In order to improve the accuracy of the A/D converter, an analog adder/subtractor 7 with a high accuracy and an analog calibration value generating DAC 8 are required. Normally, it is very difficult to ensure an accuracy of 14 or 15 bits, due to the non-linearity error of the adder/subtractor 7 which is influenced by noise and so on. Thus, the adder/subtractor 7 hinders improvement of the accuracy of the A/D converter.

Particularly, in order to realize the analog subtracting function, there are required a polarity inverting circuit and an adder/subtractor control function. The requirement also prevents the improvement of accuracy and the reduction of chip area.

As seen from the above, the conventional A/D converter of this type is disadvantageous in that it allows little improvement of the converting speed, having a limit in improving the accuracy by the calibration, and having a difficulty particularly in fabricating the adder/subtractor.

Figure 3:
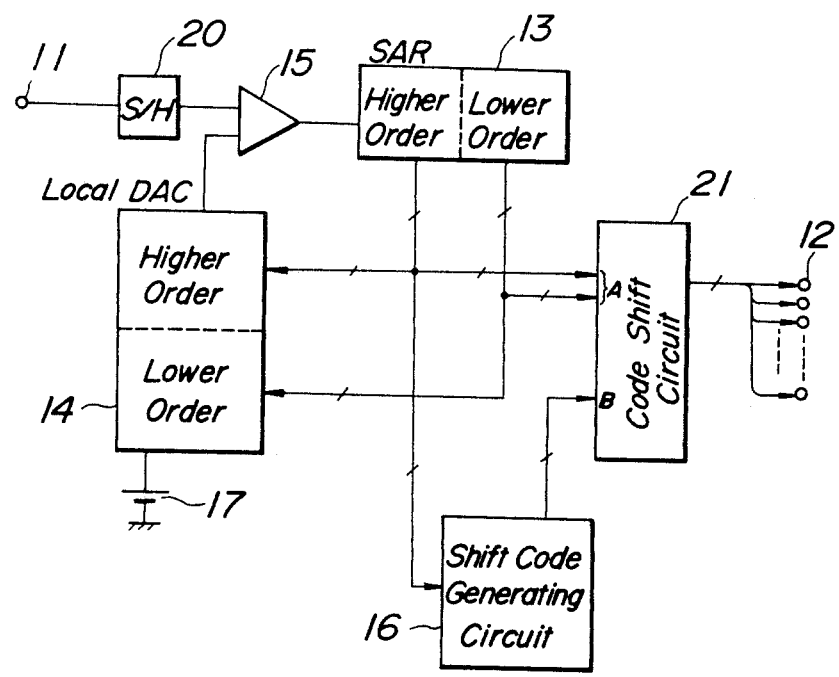
FIG. 3 is a block diagram showing the fundamental construction of an A/D converter according to the present invention.

The present invention provides an A/D converter which successfully overcomes such disadvantages. The basic construction of the A/D converter according to the invention is shown in FIG. 3. Here, reference numeral 11 designates an analog input terminal, 12 a digital output terminal, 13 an SAR, 14 a local DAC, 15 a comparator, 16 a calibration shift code generating circuit which may be constructed by a memory circuit or the like, 17 a reference voltage source for a reference voltage Vref, 20 a sample/hold circuit, and 21 a code shift circuit which may be constructed from a conventional adder/subtractor.

The local DAC 14 includes a first digital to analog converter (MDAC) which produces an output of higher order bits and a second digital to analog converter (LDAC) which produces a full scale output, as an output of lower order bits, which is always larger than every quantizing level of the first digital to analog converter. The outputs of the first and second DACs are added in an analog form to produce an analog output. Here, it is assumed that the linearity of the MDAC is not necessarily ensured but the linearity of the LDAC is ensured. It is further assumed that, in the case of the local DAC 14 in the present embodiment, the SAR 13 also has higher and lower order SAR portions, corresponding to the MDAC and LDAC, respectively.

Alternatively, a digital to analog converter having the following characteristics may be used as the local DAC 14. In the local DAC 14, linearity is ensured over the range of the lower order N bits but the linearity is not necessarily ensured over the range of higher order bits from the (N+1)th bit. In addition, in this local DAC 14, the difference between an analog output with respect to an input of which the lower order N bits are all "1", and another analog output obtained by adding "1" to an input of which the lower order N bits are all "1", so that the lower order N bits become all "0" and the (N+1)th bit becomes "1", is always negative.

Figure 4:
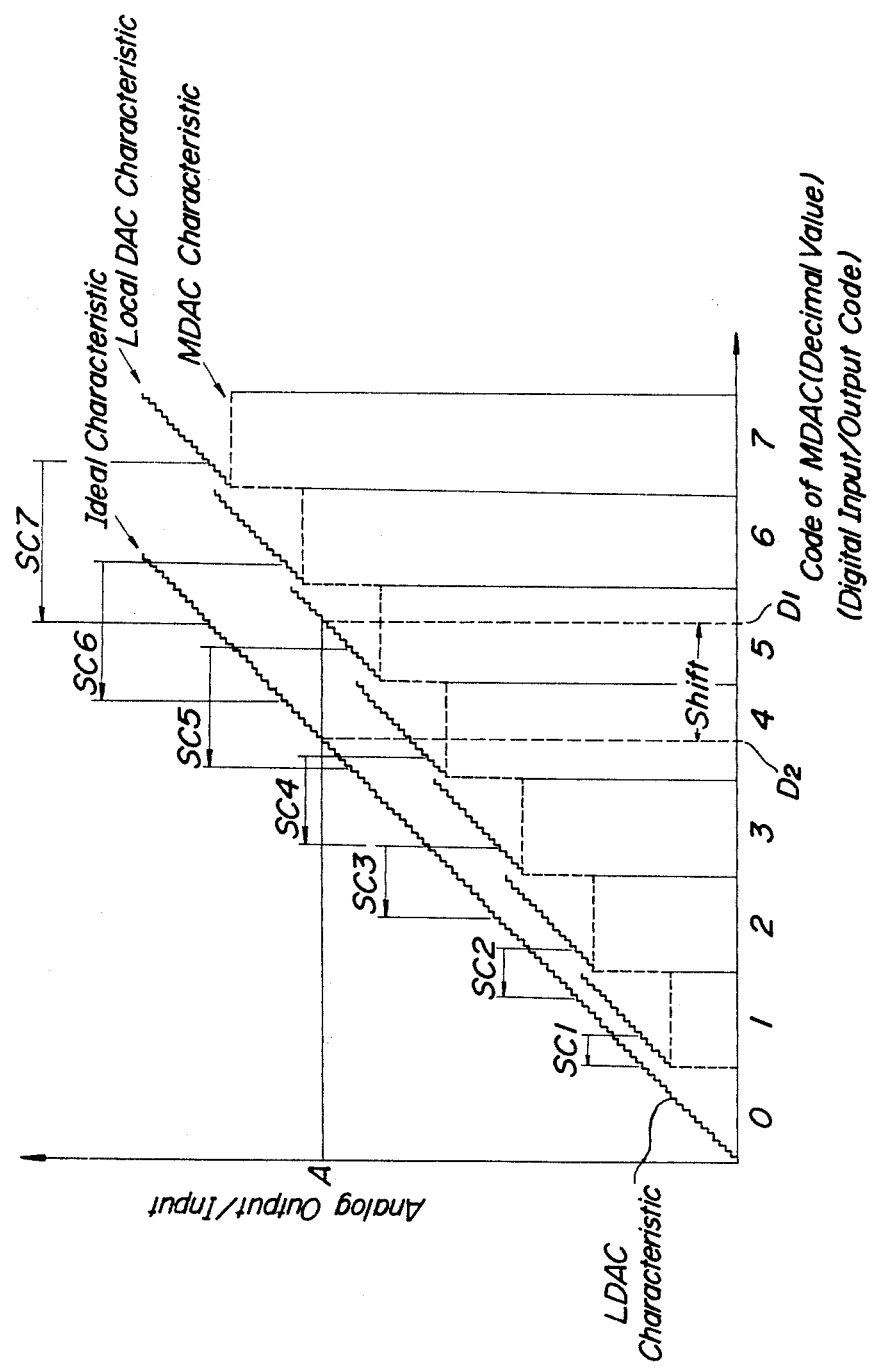
FIG. 4 is a graphical representation useful in explaining the principle of the present invention.

The characteristic of the local DAC 14 and the principle of calibration will be explained with reference to FIG. 4. In FIG. 4, the abscissa represents a digital input and the ordinate represents an analog output. As shown, the analog output always decreases at change points of the input codes of the MDAC. This indicates that the digital input always exists continuously corresponding to the analog output. Accordingly, it is seen that the calibration can be performed by shifting the input code so as to coincide with a characteristic curve plotted as an ideal characteristic curve which is obtained by extending the characteristic curve of the LDAC. Here, if it is designed that the code to be shifted is generated corresponding to the code of the MDAC, the DAC thus designed can produce a correct output code through an A/D converting operation to be explained later. Further, when the A/D converting operation is considered, the abscissa represents the digital output and the ordinate represents the analog input in FIG. 4.

Upon the receipt of an analog input A as shown in FIG. 4, a code $D_1$ is obtained from the SAR 13, through the successive approximating operation. By using a code, "5" (decimal value), corresponding to an input of the code $D_1$ to the MDAC, a predetermined shift value $SC_5$ is produced and the shift value $SC_5$ is digitally subtracted from the code $D_1$ to obtain the calibrated code $D_2$.

The A/D converting operation will further be described with reference to the circuit construction shown in FIG. 3. Codes allowing an input analog signal from the terminal 11 held by the sample/hold circuit 20 to be coincident with an output signal from the local DAC 14 are produced through the usual successive approximation operation. By the higher order codes corresponding to the MDAC input of the local DAC 14, among those codes obtained, the shift code generating circuit 16 is driven to produce a predetermined shift code. In the code shift circuit 21, the shift code is subtracted from the code from the SAR 13 formed through the successive approximating operation so as to produce a correct output code, which is derived from the terminal 12.

Figure 5:
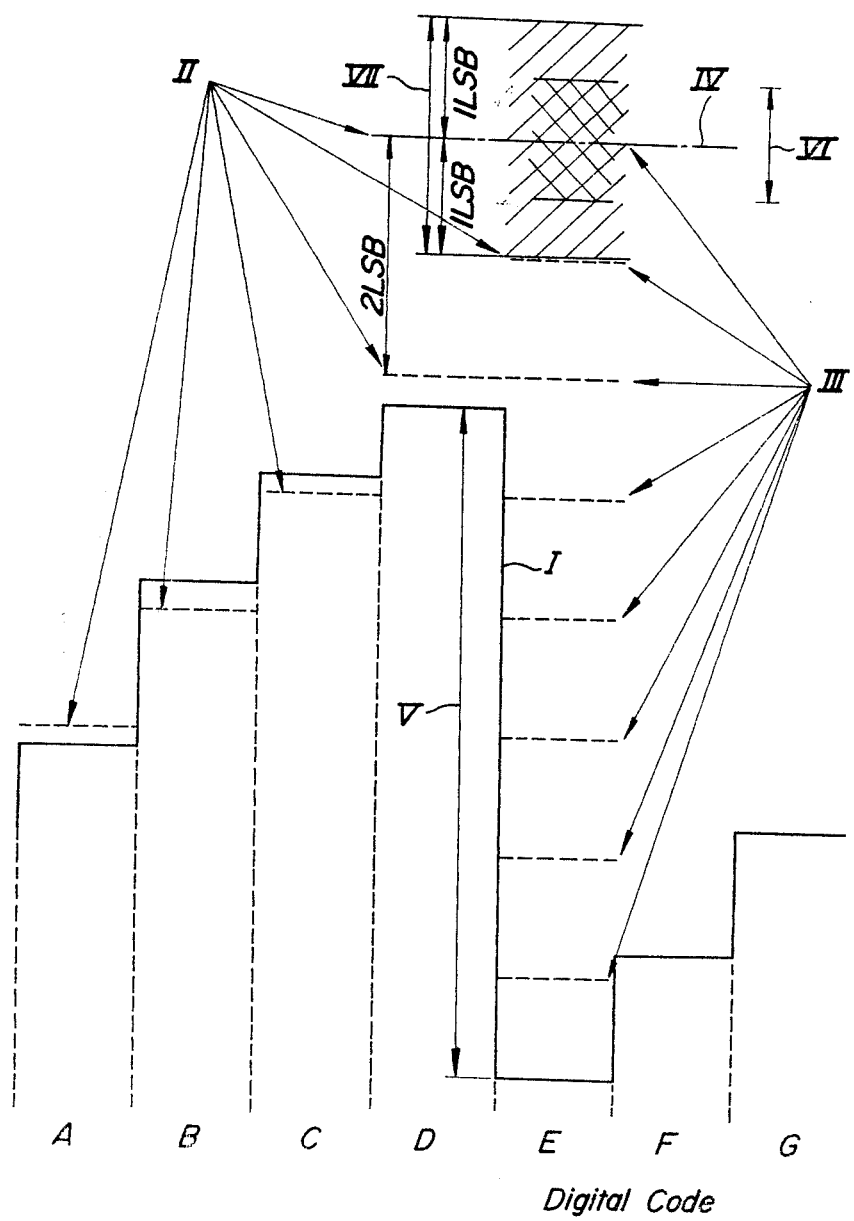
FIG. 5 is a schematic diagram for explaining the conditions for calibration according to the present invention.

The calibrating condition in the present invention will be explained with reference to FIG. 5. In FIG. 5, a solid line I designates the characteristic curve of the original local DAC. Between the digital codes D and E, there is a carry from the input signal of the LDAC to the input signal of the MDAC and the output of the local DAC decreases. A broken line II indicates the ideal output level of the original local DAC and the broken line III indicates the ideal level which may be generated by the code shift. It is assumed that a deviation of the level of the actual characteristic of the original local DAC with respect to the ideal characteristic, i.e., an error, is with $\pm\frac{1}{2}$ LSB. It is further assumed that the adder for adding the output signal from the LDAC to the output signal from the MDAC has no error and the comparator when it forms the A/D converter has also no error. In performing the calibration by shifting the input code of the local DAC, if the code is shifted so that an ideal level IV indicated by a dash and dot line is generated succeeding to the output of the digital code D, a change value V can take any value continuously. Consequently, when the ideal level III coincident with the dash and dot line IV is selected, the ideal level can be set within a range of a step value of a level which can be generated by code shifting, i.e. the range VI of $\pm\frac{1}{2}$ LSB. Output levels E, F, G, . . . up to an output level where the next carry is produced vary by an error component of $\pm\frac{1}{2}$ LSB with respect to the ideal level, so that it can fall within the range VII of $\pm 1$ LSB. Accordingly, if the adder and comparator have no error, at least one level exists within the range of $\pm 1$ LSB with respect to the ideal level, when the error of the LDAC is $\pm\frac{1}{2}$ LSB. Accordingly, if the quantizing level is 2 LSB, the DAC can be calibrated to satisfy its linearity, i.e. to have an error smaller than $\pm 1$ LSB. When the adder and the comparator have errors, the calibration can be realized by decreasing the error of the LDAC to such an extent, i.e. to be smaller than $\pm\frac{1}{2}$ LSB or reducing the quantizing level.

Three embodiments of the calibration shift code generating circuit 16 shown in FIG. 3 will be described with reference to FIGS. 6, 7 and 8.

Figure 6:
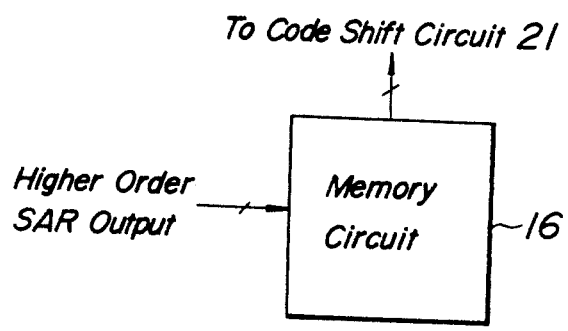
FIGS. 6, 7 and 8 are block diagrams showing three embodiments of a shift code generator in the present invention.

In FIG. 6, the calibration shift code generating circuit is formed by a single memory circuit, in which the calibration code is previously stored with respect to the codes of the MDAC and is read out corresponding to the code of the MDAC. For example, if the number of bits of the MDAC is m, a signal composed of m bits is decoded into one of ($2^m - 1$) decoded signals. The decoded signal designates a corresponding address in the memory circuit 16 for access. Therefore, the number of the memory elements and the memory capacity are ($2^m - 1$)$\times$C, if one calibration code is expressed by a digital signal of C bits.

Figure 7:
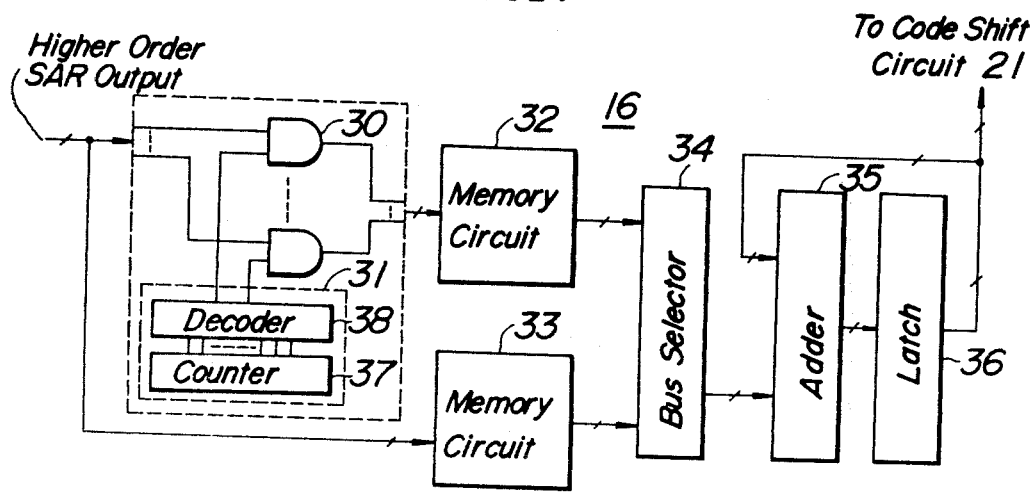

In the embodiment shown in FIG. 7, a block containing an AND array 30 and a sequencer 31, a first memory circuit 32, a second memory circuit 33, a bus selector 34, an adder 35 and a latch 36 form the calibration shift code generating circuit 16. The sequencer 31 may be formed by a conventional counter 37 and a conventional decoder which converts the binary output from the counter 37 into a signal for selecting the individual AND gates of the AND array 30 one by one successively from the highest order bit.

Generally, if the error of the DAC is caused only by the weighted components and is not dependent upon voltage or current, the addition rule is applicable to the error. If an output voltage of $V_1 + \Delta V_1$ is produced for an input signal 1000 . . . and, likewise, an output voltage $V_4 + \Delta V_4$ is produced for the input signal 0010 . . . and so on from the lower order, an output voltage $(V_1 + V_4) + (\Delta V_1 + \Delta V_4)$ is produced for the input signal 1010 . . . . That is, if the errors are $\Delta V_1$ and $\Delta V_4$, an added error $\Delta V_1 + \Delta V_4$ is obtained for the input signal 1010 . . . . This indicates a characteristic in which an added error, like $\Delta V_1 + \Delta V_4$ is obtained for the input signal 1010 . . . , when $\Delta V_1$ and $\Delta V_4$ are errors. In the embodiment shown in FIG. 7, by making use of this characteristic, an error when only one bit in the input code is "1" is stored in the first memory circuit 32. Considering the fact that there is some non-linearity error that is generated by a cause other than by the weighted components in an actual local DAC, such an error component is stored corresponding to the higher order code in the second memory circuit 33, as in the case of FIG. 6. The error with respect to an arbitrary input code is expressed by the following formula:

$$\left( \overset{*}{\underset{N=1}{\Sigma}} \epsilon ROM1_N \right) + \epsilon ROM2, \tag{1}$$

where
$\epsilon$ROM1; error of each bit stored in the first memory circuit 32.
$\epsilon$ROM2; non-linearity error stored in the second memory circuit 33.

$$\overset{*}{\underset{N=1}{\Sigma}};$$

the total sum of bits at which an input code is "1".

The circuit arrangement shown in FIG. 7 embodies equation (1). The sequencer 31 generates an output signal having bits equal in number to the number of bits of the MDAC. In the output signal, only one bit successively becomes "1" in logical level from the highest order. The number of AND gates forming the AND array 30 is likewise equal to the number of bits of the MDAC. Only when "1" is contained in respective bits of the input code, the AND gate corresponding to that "1" bit produces "1" at its output. The first memory circuit 32 storing errors corresponding to the number of bits in the MDAC is successively driven by the output signal from the AND array 30 to read out only one of the error values stored corresponding to the bit positions in the MDAC. A first control is provided such that the bus selector 34 allows a read access signal from the memory circuit 32 to pass therethrough. The error of each bit is accumulated corresponding to the input code by the combination of the adder 35 and the latch 36, so that the processing of $$\overset{*}{\underset{N=1}{\Sigma}} \epsilon ROM1_N$$

is executed. At a time point that the input code to the MDAC is established by the operation of the SAR 13 shown in FIG. 3, the second memory circuit 33 is driven by the obtained input code to the MDAC, thereby obtaining the $\epsilon ROM2$ in the above equation, i.e. the non-linearity error, and finally both errors are added by the digital adder 35 to form an error component.

With respect to the number of memory elements in this arrangement, the first memory circuit 32 has $m \times C_1$ elements, if the respective error values are expressed by $C_1$ bits and the second memory circuit 33 has $2^{m-1} \times C_2$ elements, if the respective error values are expressed by $C_2$ bits. The non-linearity error component is usually very small, so that in the embodiment of FIG. 7, the reduction in the number of memory elements is greater than in the case of FIG. 6.

Figure 8:
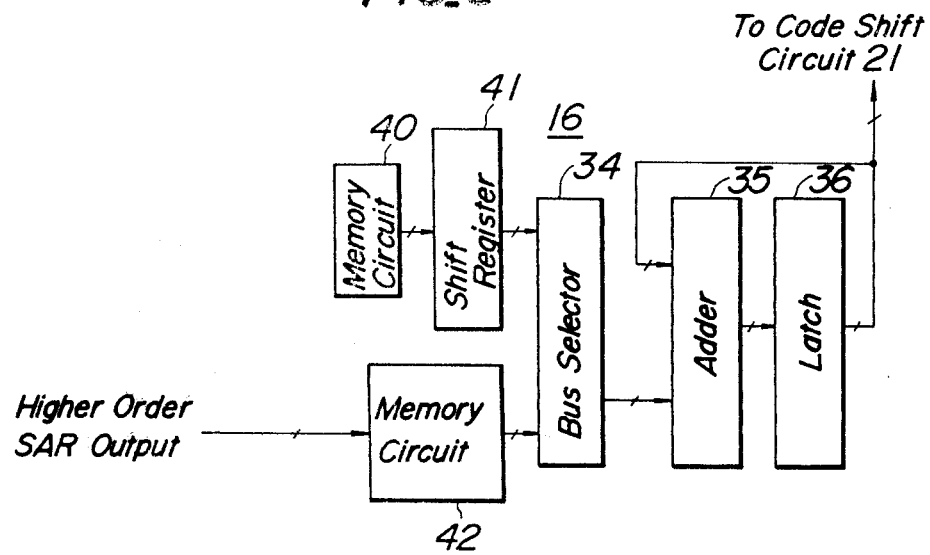

The principle of the embodiment shown in FIG. 8 is similar to that of FIG. 7, but the number of memory elements is reduced to a greater extent than in the circuit of FIG. 7. In this embodiment, the following principle is used to reduce the number of elements. Attention is paid to a negative transition in the output characteristics at a point that the input code of the MDAC changes. If it is now assumed that the local DAC has no error except the negative transition, then the error is given as follows:

$$\left( \overset{*}{\underset{m=0}{\Sigma}} 2^{m-1} \right) \times JUMP, \quad (2)$$

where $$\overset{*}{\underset{m=0}{\Sigma}} 2^{m-1}$$

is the decimal value of the input code to the MDAC. JUMP is a digital value corresponding to the negative transition in the output characteristics at a point that the input code of the MDAC changes.

Accordingly, if the JUMP, and the linearity and non-linearity errors actually existing in the local DAC are stored, an error component considering all of the actual error factors can be generated. While in order to execute the processing of the above equation (2), a multiplier is required, the processing of the above equation (2) can be executed in a simple shifting manner, if the JUMP is given by binary weighting 2, 4, 8, 16, . . . . In the embodiment shown in FIG. 8, the JUMP is stored in the form of a binary value in the first memory circuit 40 and the shift register 41 performs a multiplication of the JUMP. Stored in the second memory circuit 42 is the result of the subtraction of the JUMP in the above equation from the actual error in the local DAC. As a result, the total error can be produced, as in the case of FIG. 7. The number of memory elements is this case is $(m + 2^{m-1} \cdot C_3)$ on the basis of the same definition as in the case of FIG. 7, where $C_3$ represents the number of bits representing the non-linearity error value. In FIG. 8, the same reference numerals as in FIG. 7 are used to designate like portions in FIG. 7 and the explanations of these portions are omitted here.

Figure 9:
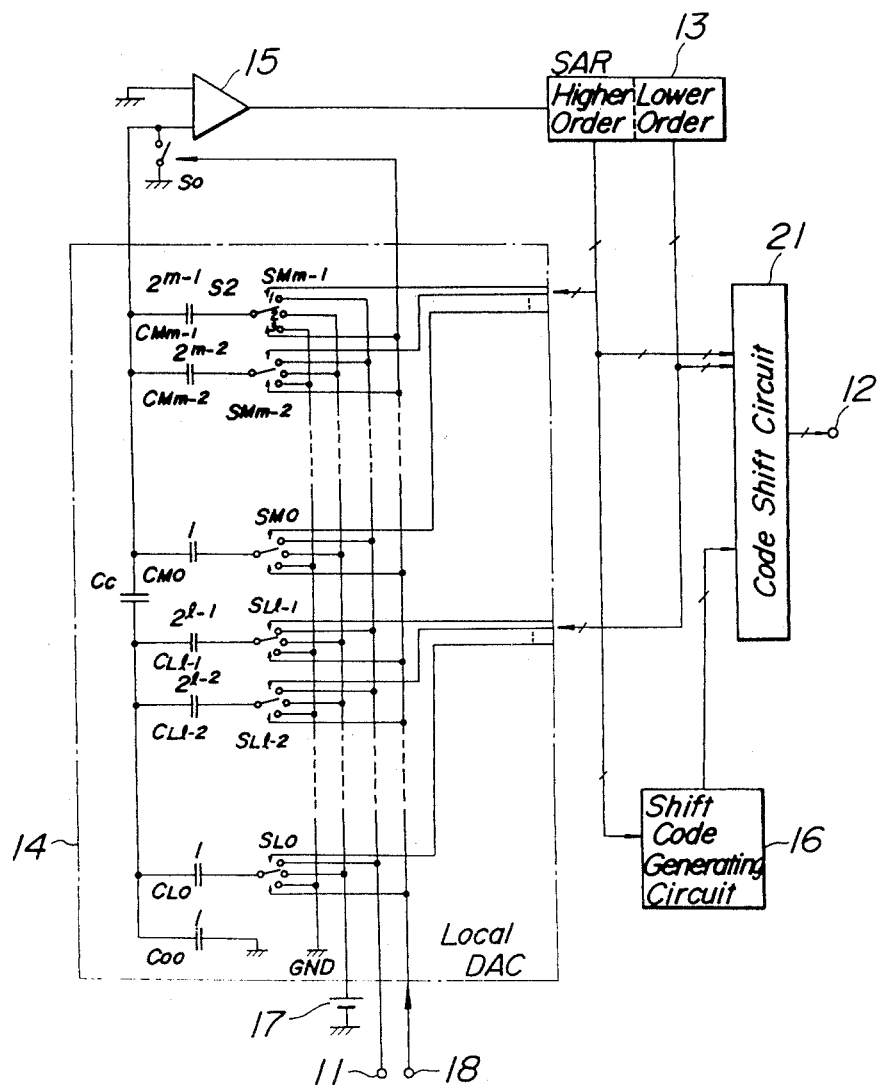

FIG. 9 shows an embodiment of the local DAC 14 with an analog addition function. In FIG. 9, the same reference numerals as in FIG. 3 designate like portions in FIG. 3 and the explanations of these portions are omitted here. In the present embodiment, the local DAC 14 has a capacitor array of lower order capacitors $C_{00}, C_{L0}, C_{L1}, \ldots, C_{Ll-1}$, a capacitor array of higher order capacitors $C_{M0}, C_{M1}, \ldots, C_{Mm-1}$, a coupling capacitor $C_c$ for coupling those capacitor array, and an analog switch array $S_{L0}, S_{L1}, \ldots S_{Ll-1}, S_{M0}, S_{M1}, \ldots, S_{Mm-1}$.

In the present embodiment, the sample/hold circuit 20 and the DAC 14 are integrally formed by making use of the fact that the DAC 14 using the capacitor array also performs sampling and holding operations. All of the analog switches are first grounded through switch positions 3 to discharge charges stored in all the capacitors. Then, the analog switches are turned to the switch positions 1 in accordance with a signal supplied to the terminal 18 and also the analog switch $S_0$ is closed. As a result, the higher and lower order capacitors are charged in accordance with an analog voltage from the terminal 11. The signal at the terminal 18 is terminated to open the switch $S_0$, thereby holding the analog voltage in the capacitor array. At this time, the analog switch array is controlled in such a way that, when an input code supplied to the analog switches corresponding to the upper and lower order SAR output signals from the SAR 13, i.e., the digital input code, is "1", the reference voltage Vref from the power source 17 is applied to the capacitor array through the switch positions 2, and that when the input code is "0", ground potential GND is applied through the switch positions 3 to the capacitor array. Under this control of the analog switch array, the charge corresponding to the code produced in the SAR 13 is subtracted from the charge generated corresponding to the analog input signal. At the end of the successive approximation, little charge is left in all of the capacitors, so that a digital code of the original DAC corresponding to the input analog value is obtained. The digital output from the original DAC is subjected to the calibration processing of shifting the code, as shown in FIG. 3, so that a correct digital output signal is obtained.

The characteristic of the local DAC shown in FIG. 9 is expressed by the following equation:

$$V_0 = \frac{(2^l \cdot C_0 + C_c) \overset{*}{\underset{m}{\Sigma}} 2^{m-1} \cdot C_0 + C_c \cdot C_0 \overset{*}{\underset{l}{\Sigma}} 2^{l-1}}{(2^l \cdot C_0 + C_c) \{(2^m - 1) C_0 + C_c\} - C_c^2} \cdot V_{ref} \quad (3)$$

Here, if the capacitance of the LDAC as viewed from the MDAC through the coupling capacitor $C_c$ is equal to the unit capacitance $C_0$, i.e., $$C_c = \{2^l/(2^l - 1)\} C_0,$$

equation (3) becomes $$V_0 = \frac{2^l \overset{*}{\underset{m}{\Sigma}} 2^{m-1} + \overset{*}{\underset{l}{\Sigma}} 2^{l-1}}{2^{l+m}} \cdot V_{ref}. \quad (4)$$

Equation (4) indicates that the local DAC serves as a usual DAC with a resolution of $(m+l)$. If $C_c > \{2^l/(2^l - 1)\} C_0$, a characteristic is obtained in which the output change of the DAC is always decreased at every point that the input code of the MDAC changes. Thus, a desired characteristic can be realized in a combined manner without using the analog adder.

Figure 10:
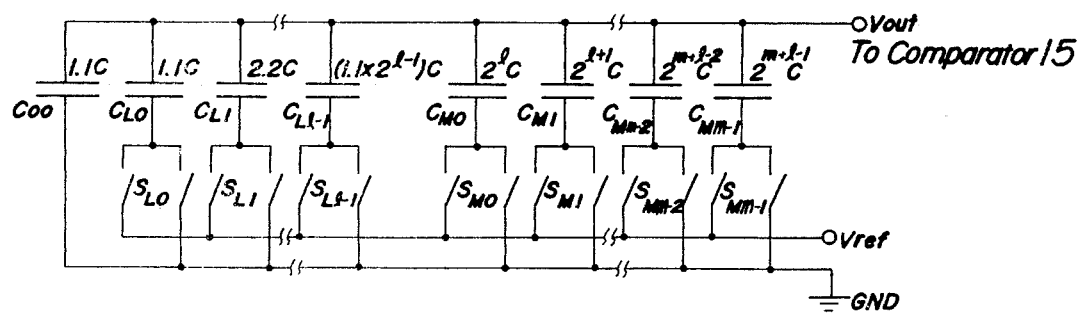
FIGS. 9 and 10 are circuit diagrams showing embodiments of a local D/A converter in the present invention.

FIG. 10 shows an embodiment in which a single capacitor array, instead of the separated higher and lower order capacitor array as shown in FIG. 9, is used for the DAC construction. In the present embodiment, analog switches $S_{L0}, S_{L1} \ldots, S_{Ll-1}, S_{M0}, S_{M1} \ldots, S_{Mm-1}$ are controlled as in the case of FIG. 9 to perform the successive approximation. The capacitances of the capacitors $C_{00}, C_{L0}, C_{L1} \ldots, C_{L-1}; C_{M0}, C_{M1} \ldots, C_{Mm-1}$ are 1.1C, 1.1C, 2.2C, ..., $(1.1 \times 2^{l-1})C$; $2^lC$, $2^{l+1}C, \ldots, 2^{m+l-1}C$. The lower order bit portion of the capacitors $C_{00}$-$C_{Ll-1}$ corresponds to the LDAC, and its full scale is (8.8C/128.8C) Vref when l=3 and is so selected as to be larger than one step in the capacitors $C_{M0}, \ldots, C_{Mm-1}$ in the higher order bit portion corresponding to the MDAC, for example, (8C/128.8C)Vref when m=4. An A/D converter according to the present invention may be arranged by using the DAC in the present embodiment for the DAC 14 shown in FIG. 3.

In the above-mentioned embodiments, explanation has been made of the code shift circuit 21 in the form of a subtractor in which the shift code from the shift code generator 16 is subtracted from the higher order SAR output from the SAR 13. Alternatively, the shift code circuit 21 may be in the form of an adder, and a 2's complement of the shift code is stored in the shift code generating circuit 16. The complement output is added to the higher order SAR output by the adder.

As described above, the non-linearity error such as a conversion error due to a carry during the course of A/D conversion is calibrated in a manner of code conversion. In order to generate the shift code, in the embodiment of FIG. 7, it is not necessary to access to the memory circuit at every successive approximating operation, but it is sufficient that the memory circuit be accessed only once at the termination of the successive approximating operation of the higher order bits and access to the memory may be performed in parallel with the successive approximating operation of the lower order bits. As a consequence, the conversion time is remarkably improved. Usually, the access time of the memory circuit is about 300 ns to 1 $\mu$s, and the conversion time is improved by multiplication of the number of bits, e.g. 4 to 14 $\mu$s for 14 bits. The response times of the local DAC and the comparator are substantially equal to that of the memory circuit. In this case, the conversion time is improved about two times. Also in the cases of FIGS. 7 and 8, the number of accesses to the memory circuit corresponds to the number of bits in the MDAC, and therefore the conversion speed is improved to such an extent.

When the higher and lower order capacitor array shown in FIG. 9 or the single capacitor array shown in FIG. 10 is used for the local DAC, no analog adder is required, so that an important factor in causing error due to the usage of the analog adder is eliminated and accordingly high accuracy and high speed are attained. In a general analog adder, it is difficult to limit its error within an accuracy of 14 or 15 bits. It means that the usage of the analog adder almost determines the limit of improvement in the accuracy of the A/D converter. Therefore, in an arrangement using no analog adder, as in the present invention, only the error of the comparator determines the limit of the accuracy improvement and thus a remarkably improved accuracy is attained. Additionally, the A/D conversion speed is improved to the extent of the response time of the analog adder.

Let us consider the conversion time when the 14 bit A/D converter is realized in accordance with the present invention. The higher order capacitors of 8 bits and the lower order capacitors of 8 bits are used for the local DAC. The total resolution is 16 bits. 2 bits are used for calibration, and the output level can be selected with a resolution of ¼ LSB. The matching tolerance of the unit capacitor of 1 pF is about 1.26% (3$\delta$) when the usual CMOS process is used and the error of the DAC of 8 bits is about 0.04 LSB. Therefore, the linearity of the LDAC is well satisfied. An error of the comparator in this case is allowable up to a value $\pm$0.21 LSB obtained by subtracting the error 0.04 LSB of the LDAC and the calibration resolution ¼ LSB from ½ LSB for 14 bits, based upon the circuit of FIGS. 3 and 6. The conversion time is roughly calculated. The simulation conducted by us showed that 400 ns is possible for the settling time of the capacitor array, even though the settling time depends on a switch dimension. When the accuracy of the comparator is $\pm$0.21 LSB, 100 ns can be obtained for the operation time of the comparator. The operation time of one successive approximation is about 550 ns when a delay in the logical circuit section is about 50 ns. Since the number of times that the successive approximation is performed is the number of bits in the local DAC, i.e. 16 times, the conversion time is about 8.8 $\mu$s. Finally, if the delay of the adder is 200 ns, the total conversion time thus obtained is 9 $\mu$s, i.e., 110 ksps.

As seen from the foregoing description, according to the present invention, an A/D converter with an accuracy of 14 bits and at a high speed of 110 ksps, which can not be realized by any conventional LSI technology, can be realized by using the usual CMOS process.

In the conventional technology, since such a high performance A/D converter is constructed by using discrete components, its manufacturing cost is very high. On the other hand, the present invention can realize an A/D converter by using the usual CMOS process and therefore a remarkable cost reduction is attained.

An A/D converter according to the present invention is effective in various digital signal processings requiring high speed and high accuracy, such as a broad band voice CODEC, a speech-synthesizer, a speech-recognizer or the like in which an analog signal is converted to a digital signal for digital signal processing. An A/D converter according to the present invention may be provided in a compact size in the form of a one chip LSI, and hence is effectively used for various signal processings in combination with a one chip microprocessor. Furthermore, an A/D converter according to the invention may be constructed by using two conventional DAC-ICs that are commercially available with a low resolution and some discrete components. In this case, high accuracy and high resolution are also easily attained. Thus, whether constructed by LSI technology or discrete components, the present invention is advantageous.

What is claimed is:

1. An analog to digital converter comprising:
   a successive approximation register;
   a local digital to analog converter having
      a first digital to analog converter for generating an output of higher order bits, said first digital to analog converter including a first capacitor array having capacitors arranged with binary weighting corresponding to a train of higher order bits of a digital code from said successive approximation register and a first analog switch array having analog switches for selectively connecting one terminal of each of said capacitors of said first capacitor array to an analog input, a reference voltage or ground;

a second digital to analog converter for generating a full scale output as an output of lower order bits which is always larger than every quantizing level of said first digital to analog converter, said second digital to analog converter including a second capacitor array having capacitors arranged with binary weighting corresponding to a train of lower order bits of said digital code and a second analog switch array having analog switches for selectively connecting one terminal of each of said capacitors of said capacitor array to said analog input, the reference voltage or ground, the other terminals of said capacitors in said first capacitor arrays being connected in common to an output point of said first digital to analog converter and the other terminals of said capacitors in said second capacitor array being connected in common to an output point of said second digital to analog converter; and a coupling capacitor coupling the output points of said first and second digital to analog converters, the equivalent capacitance formed by said second digital to analog converter and said coupling capacitor across the output point of said first digital to analog converter being larger than the unit capacitance of said first digital to analog converter, said first and second analog switch arrays controlling sampling and holding of said analog input signal, and the output of said first digital to analog converter being added to the output of said second digital to analog converter to provide an analog output of said local digital to analog converter;

a comparator for comparing the ground potential with said analog output from said local digital to analog converter, said successive approximation register being coupled to the output of said comparator and having a higher order portion and a lower order portion corresponding to said first and second digital to analog converters for performing successive approximations in accordance with the output from said comparator to store said digital code having a higher order portion and a lower order portion;

means for coupling the higher and lower order portions of said successive approximation register to said first and second analog switch arrays;

a shift code generating circuit coupled to the higher order portion of said successive approximation register for storing a shift code for shifting said higher order portion of said digital code previously allotted to each digital code from said successive approximation register, an actual digital to analog conversion characteristic in said local digital to analog converter thereby being calibrated for an ideal digital to analog conversion characteristic, said shift code generating ciruit further generating a shift code in response to said higher order portion of said digital code from said successive approximation register; and a code shift circuit coupled to said successive approximation register and said code shift generating circuit for digitally shifting said higher and lower order portions of said digital code from said successive approximation register in accordance with said shift code from said shift code generating circuit to generate an analog to digital conversion output signal.

2. An analog to digital converter as claimed in claim 1, wherein said code shift circuit is a digital adder/subtractor for performing digital addition/subtraction between said digital code and said shift code.

3. An analog to digital converter as claimed in claim 1, wherein said second digital to analog converter is linear, and said shift code generating circuit stores, as said shift code, the difference between an input digital code corresponding to an analog output on an ideal characteristic as a digital to analog conversion characteristic obtained by extrapolating an output characteristic of said second digital to analog converter over a range extending to said higher order bits, and an input digital code allowing said local digital to analog converter to generate an analog output of said ideal characteristic.

4. An analog to digital converter as claimed in claim 2, wherein said second digital to analog converter is linear, and said shift code generating circuit stores, as said shift code, the difference between an input digital code corresponding to an analog output on an ideal characteristic as a digital to analog conversion characteristic obtained by extrapolating an output characteristic of said second digital to analog converter over a range extending to said higher order bits, and an input digital code allowing said local digital to analog converter to generate an analog output of said ideal characteristic.

5. An analog to digital converter comprising:
a successive approximation register;
a sample/hold circuit for sampling and holding an analog input signal;
a local digital to analog converter having a capacitor array including capacitors arranged with binary weighting corresponding to a train of higher and lower order bits of a digital code from said successive approximation register and an analog switch array having analog switches for selectively connecting one terminal of each of said capacitors in said capacitor array to a reference voltage or ground, the other terminals of said capacitors in said capacitor array being connected in common to an output point of said local digital to analog converter, said local digital to analog converter generating a full scale output of a lower order bit portion which is always larger than every quantizing level of a higher order bit portion;
a comparator for comparing the sample/hold output from said sample/hold circuit with the analog output from said local digital to analog converter, said successive approximation register being coupled to the output of said comparator and having a higher order portion and a lower order portion corresponding to said higher and lower order bits of said digital code for performing successive approximation in accordance with the output from said comparator to store said digital code having said higher and lower bits;
means for coupling the higher and lower order portions of said successive approximation register to said analog switch array;
a shift code generating circuit coupled to the higher order portion of said successive approximation register for storing a shift code for shifting said higher order bits of said digital code previously allotted to each digital code from said successive approximation register, an actual digital to analog conversion characteristic in said local digital to analog converter thereby being calibrated for an ideal digital to analog converting characteristic, said shift code generating circuit further generating a shift code in response to said higher order bits of said digital code from said successive approximation register; and a code shift circuit coupled to said successive approximation register and said code shift generating circuit for digitally shifting said higher and lower order bits of said digital code from said successive approximation register in accordance with said shift code from said shift code generating circuit to generate an analog to digital conversion output signal.

6. An analog to digital converter as claimed in claim 5, wherein said code shift circuit is a digital adder/subtractor for performing digital addition/subtraction between said digital code and said shift code.

7. An analog to digital converter as claimed in claim 5, wherein said shift code generating circuit stores, as said shift code, the difference between an input digital code corresponding to an analog output on an ideal characteristic as a digital to analog conversion characteristic obtained by extrapolating a digital to analog conversion output characteristic from said lower order bit portion over a range extending beyond said least significant bit in said higher order bit portion, and an input digital code allowing said local digital to analog converter to generate an analog output of said ideal characteristic.

8. An analog to digital converter as claimed in claim 6, in which said shift code generating circuit stores, as said shift code, the difference between an input digital code corresponding to an analog output on an ideal characteristic as a digital to analog conversion characteristic obtained by extrapolating a digital to analog conversion output characteristic from said lower order bit portion over a range extending beyond said least significant bit in said higher order bit portion, and an input digital code allowing said local digital to analog converter to generate an analog output of said ideal characteristic.

* * * * *

UNITED STATES PATENT AND TRADEMARK OFFICE
CERTIFICATE OF CORRECTION

PATENT NO. : 4,415,882
DATED : November 15th, 1983
INVENTOR(S) : Yukio AKAZAWA et al It is certified that error appears in the above—identified patent and that said Letters Patent is hereby corrected as shown below:

In the heading of the patent, under [30] Foreign Application Priority Data, the priority date is wrong, instead of "Jul. 31, 1981" it should read --Jul. 13, 1981--.

Signed and Sealed this

Tenth Day of January 1984

[SEAL]

Attest:

GERALD J. MOSSINGHOFF

Attesting Officer    Commissioner of Patents and Trademarks